United States Patent
Ino

(10) Patent No.: US 10,292,271 B2
(45) Date of Patent: May 14, 2019

(54) HIGH-FREQUENCY MODULES

(71) Applicant: Murata Manufacturing Co., Ltd., Kyoto (JP)

(72) Inventor: Yusuke Ino, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/333,509

(22) Filed: Oct. 25, 2016

(65) Prior Publication Data

US 2017/0118841 A1 Apr. 27, 2017

(30) Foreign Application Priority Data

Oct. 26, 2015 (JP) .................. 2015-209908

(51) Int. Cl.
*H05K 1/18* (2006.01)
*H01L 23/367* (2006.01)
(Continued)

(52) U.S. Cl.
CPC ......... *H05K 1/181* (2013.01); *H01L 23/3677* (2013.01); *H01L 23/552* (2013.01); *H01L 23/66* (2013.01); *H01L 24/06* (2013.01); *H01L 24/48* (2013.01); *H01L 24/49* (2013.01); *H03F 1/56* (2013.01); *H03F 3/19* (2013.01); *H03F 3/195* (2013.01); *H03F 3/213* (2013.01); *H03F 3/245* (2013.01); *H05K 1/0206* (2013.01); *H05K 1/0224* (2013.01); *H05K 1/0243* (2013.01); *H05K 1/111* (2013.01); *H01L 24/05* (2013.01); *H01L 2223/665* (2013.01); *H01L 2223/6611* (2013.01); *H01L 2223/6655* (2013.01); *H01L 2223/6683* (2013.01); *H01L 2223/6688* (2013.01); *H01L 2224/04042* (2013.01); *H01L 2224/05553* (2013.01);
(Continued)

(58) Field of Classification Search
CPC .... H05K 1/181; H05K 1/18; H05K 2203/049; H01L 23/66; H03F 3/195
USPC .................. 361/719; 445/144, 130
See application file for complete search history.

(56) References Cited

U.S. PATENT DOCUMENTS 5,146,178 A 9/1992 Nojima et al.
7,030,490 B2 * 4/2006 Lee
(Continued)

FOREIGN PATENT DOCUMENTS

JP H04-183008 A 6/1992
JP 2002-57511 A 2/2002
(Continued)

OTHER PUBLICATIONS

English translation of JP reference 2009284238A.*
Oguro English translation (Year: 2014).*
Japanese Notice of Reasons for Rejections dated, Dec. 12, 2017.

Primary Examiner — Mandeep S Buttar
(74) Attorney, Agent, or Firm — Pearne & Gordon LLP

(57) ABSTRACT

A high-frequency module according to the present disclosure includes: an MMIC; a multilayer substrate on which the MMIC is mounted; a signal wire that is arranged above the multilayer substrate, is connected to the MMIC and is a transmission path that transmits a high-frequency signal outputted from the MMIC; and a ground wire having at least one end that is connected to a ground electrode on an upper surface of the multilayer substrate and that is arranged so as to straddle the signal wire.

21 Claims, 11 Drawing Sheets

(51) Int. Cl.
*H01L 23/552* (2006.01)
*H01L 23/66* (2006.01)
*H01L 23/00* (2006.01)
*H03F 3/195* (2006.01)
*H03F 3/213* (2006.01)
*H05K 1/02* (2006.01)
*H05K 1/11* (2006.01)
*H03F 1/56* (2006.01)
*H03F 3/19* (2006.01)
*H03F 3/24* (2006.01)

(52) U.S. Cl.
CPC ........... *H01L 2224/05554* (2013.01); *H01L 2224/0603* (2013.01); *H01L 2224/45124* (2013.01); *H01L 2224/45144* (2013.01); *H01L 2224/45147* (2013.01); *H01L 2224/48157* (2013.01); *H01L 2224/4917* (2013.01); *H01L 2224/49175* (2013.01); *H01L 2924/00014* (2013.01); *H01L 2924/19107* (2013.01); *H01L 2924/3025* (2013.01); *H03F 2200/387* (2013.01); *H03F 2200/451* (2013.01); *H05K 1/0209* (2013.01); *H05K 2201/10098* (2013.01)

(56) References Cited

U.S. PATENT DOCUMENTS

| | | | |
|---|---|---|---|
| 2002/0017952 | A1 | 2/2002 | Nakai et al. |
| 2004/0065462 | A1* | 4/2004 | Hayashi ............... H01L 21/563 174/548 |
| 2005/0009484 | A1 | 1/2005 | Imai |
| 2006/0097382 | A1* | 5/2006 | Mori .................. H01L 23/3677 257/706 |
| 2008/0223609 | A1* | 9/2008 | Yamamoto ............ H05K 3/303 174/260 |
| 2012/0092218 | A1* | 4/2012 | Akasegawa ........ H01L 23/3677 342/385 |

FOREIGN PATENT DOCUMENTS

| | | | | |
|---|---|---|---|---|
| JP | 2005-033350 A | | 2/2005 | |
| JP | 2005-191435 A | | 7/2005 | |
| JP | 2005-353713 A | | 12/2005 | |
| JP | 2009284238 A | * | 12/2009 | ............ H01L 24/49 |
| JP | 2013-138147 A | | 7/2013 | |
| JP | 2014-107486 A | | 6/2014 | |
| JP | 2014107486 | * | 6/2014 | |
| JP | 2014107486 A | * | 6/2014 | |

* cited by examiner

HIGH-FREQUENCY MODULES

This application claims priority from Japanese Patent Application No. 2015-209908 filed on Oct. 26, 2015. The contents of these applications are incorporated herein by reference in their entireties.

BACKGROUND OF THE DISCLOSURE

1. Field of the Disclosure

The present disclosure relates to high-frequency modules.

2. Description of the Related Art

In the related art, a configuration is known in which, in a high-frequency module including a circuit board on which a high-frequency component is mounted, a high-frequency signal outputted from the high-frequency component is transmitted to the circuit board via a conductive member (for example, refer to Japanese Unexamined Patent Application Publication No. 2005-33350). In this high-frequency module, the high-frequency component (semiconductor chip) and the circuit board (module wiring board) are connected to each other by the conductive member (bonding wire) that transmits the high-frequency signal.

However, in the above-described high-frequency module of the related art, a harmonic of the high-frequency signal may radiate from the conductive member. Specifically, a configuration has been considered in which the radiation of a harmonic to the outside is suppressed by using a ground electrode formed on a circuit board as a shield conductor in a high-frequency module. However, in a configuration where a high-frequency component and a circuit board are connected to each other with a conductive member such as a bonding wire, since the conductive member is exposed from the circuit board, it is difficult to suppress the radiation of a harmonic using a ground electrode.

BRIEF SUMMARY OF THE DISCLOSURE

Accordingly, an object of the present disclosure is to provide a high-frequency module that can reduce the radiation of a harmonic.

In order to achieve this object, a high-frequency module according to a preferred embodiment of the present disclosure includes: a high-frequency component; a circuit board on which the high-frequency component is mounted; a conductive member that is arranged above or on the circuit board, is connected to the high-frequency component and is a transmission path that transmits a high-frequency signal outputted from the high-frequency component; and a first wire having at least one end that is connected to a ground electrode on an upper surface of the circuit board and that is arranged so as to straddle the conductive member.

Thus, the first wire that is connected to the ground electrode and straddles the conductive member that transmits the high-frequency signal from the high-frequency component functions as a shield conductor. Therefore, a harmonic radiated from the conductive member is blocked by the first wire and consequently the radiation of the harmonic to the outside of the high-frequency module can be reduced.

In addition, the first wire may intersect the conductive member in a plan view of the circuit board.

Thus, since the first wire intersects the conductive member in a plan view of the circuit board, an increase in the size of the high-frequency module in a direction in which the conductive member extends can be suppressed.

Furthermore, both ends of the first wire may be connected to the ground electrode, the ground electrode being formed of a single pattern conductor.

Thus, since both ends of the first wire are connected to the ground conductor formed of a single pattern conductor, the shielding effect realized by the first wire can be improved. Therefore, the radiation of a harmonic to the outside of the high-frequency module can be further reduced.

Furthermore, the circuit board may have a thermal via for allowing heat generated by the high-frequency component to radiate through the circuit board, at least one end of the first wire being connected to the ground electrode, the ground electrode being connected to the thermal via and being formed of a pattern conductor.

Thus, since at least one end of the first wire is connected to the ground electrode that is connected to the thermal via and is formed of a pattern conductor, the shielding effect realized by the first wire can be further improved. Therefore, the radiation of a harmonic to the outside of the high-frequency module can be further reduced.

In addition, the high-frequency component may have built therein a power amplifier that amplifies a signal of a prescribed band.

Thus, since the high-frequency component has a power amplifier built therein, the high-frequency signal outputted from the high-frequency component is a comparatively large signal. In other words, a particularly large harmonic can radiate from the conductive member. Therefore, as a result of the conductive member being straddled by the first wire, the particularly large harmonic can be suppressed and consequently the radiation of the harmonic can be effectively reduced.

In addition, the conductive member may transmit the high-frequency signal of the prescribed band amplified by the power amplifier.

Here, since the conductive member transmits the high-frequency signal of the prescribed band amplified by the power amplifier, the conductive member can radiate a particularly large harmonic. Therefore, as a result of the conductive member being straddled by the first wire, the particularly large harmonic can be suppressed and consequently the radiation of the harmonic can be effectively reduced.

Furthermore, the conductive member may transmit the high-frequency signal that has been amplified by the power amplifier and has a frequency that is n times (n is an integer of 2 or higher) a frequency of the prescribed band.

Here, since the conductive member transmits the high-frequency signal that has been amplified by the power amplifier and has the frequency that is n times the frequency of the prescribed band, the conductive member can radiate a particularly large harmonic. Therefore, as a result of the conductive member being straddled by the first wire, the particularly large harmonic can be suppressed and consequently the radiation of the harmonic can be effectively reduced.

In addition, the conductive member may be a second wire that connects a pad electrode of the high-frequency component and a pad electrode of the circuit board to each other.

The second wire is exposed from the circuit board and therefore cannot be shielded by the circuit board. Consequently, a harmonic is particularly likely to radiate from the second wire to the outside of the high-frequency module. Therefore, the radiation of a harmonic from a location where a harmonic is likely to radiate can be suppressed as a result of the second wire being straddled by the first wire and therefore the radiation of a harmonic to the outside of the high-frequency module can be effectively reduced.

In addition, the conductive member may be a pattern conductor that is arranged on an upper surface of the circuit board.

The pattern conductor is exposed from the circuit board and therefore cannot be shielded by the circuit board. Consequently, a harmonic is particularly likely to radiate from the pattern conductor to the outside of the high-frequency module. Therefore, the radiation of a harmonic from a location where a harmonic is likely to radiate can be suppressed as a result of the pattern conductor being straddled by the first wire and therefore the radiation of a harmonic to the outside of the high-frequency module can be effectively reduced.

Other features, elements, characteristics and advantages of the present disclosure will become more apparent from the following detailed description of preferred embodiments of the present disclosure (with reference to the attached drawings).

DETAILED DESCRIPTION OF THE DISCLOSURE

Figure 1:
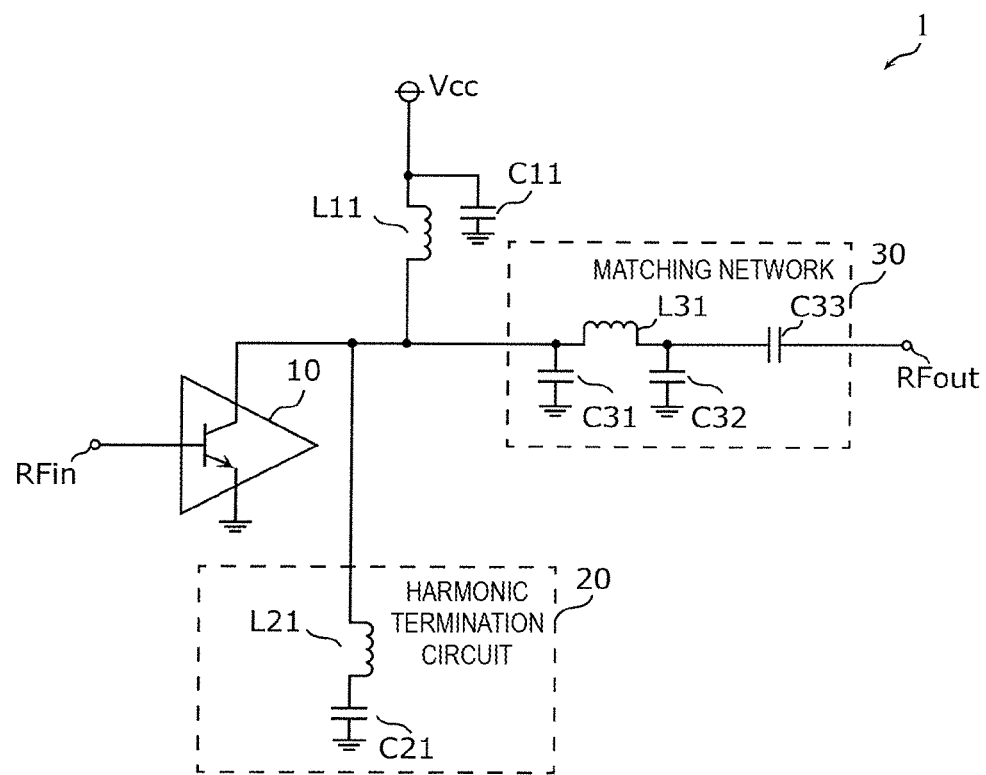
FIG. 1 illustrates the circuit configuration of a high-frequency module according to an embodiment.

Hereafter, high-frequency modules according to embodiments of the present disclosure will be described while referring to the drawings. The embodiments described hereafter each describe a specific preferred example of the present disclosure. The numerical values, shapes, materials, constituent elements, arrangement positions of the constituent elements, the ways in which the constituent elements are connected and so forth given in the following embodiments are merely examples and are not intended to limit the present disclosure. Furthermore, constituent elements not described in the independent claim that describes the most generic concept of the present disclosure among constituent elements in the following embodiments are described as arbitrary constituent elements. In addition, in each drawing, the dimensions and so forth are not illustrated in a strict manner.

(Embodiment)

First, the circuit configuration of a high-frequency module 1 will be described.

FIG. 1 illustrates the circuit configuration of the high-frequency module 1 according to this embodiment.

The high-frequency module 1 is, for example, a module arranged in the front end unit of a cellular phone or the like that supports multiples modes/multiple bands or carrier aggregation (CA). The high-frequency module 1 amplifies a transmission signal inputted from a radio frequency integrated circuit (RFIC) and outputs the amplified transmission signal to an antenna or the like. As illustrated in FIG. 1, the high-frequency module 1 includes a power amplifier 10, an inductor L11, a capacitor C11, a harmonic termination circuit 20 and a matching network 30.

The power amplifier 10 amplifies a signal of a prescribed band (for example, 700-800 MHz band) and includes amplification elements such as field effect transistors (FETs) and heterojunction bipolar transistors (HBT) connected in multiple stages. In this embodiment, the power amplifier 10 amplifies a high-frequency signal of a prescribed band inputted to an input terminal RFin from an RFIC (not illustrated) and outputs the amplified signal to an external antenna (not illustrated) from an output terminal RFout via the matching network 30.

The inductor L11 and the capacitor C11 form an example of a bias circuit that supplies a bias voltage Vcc to the power amplifier 10.

The harmonic termination circuit 20 is a filter circuit that is arranged between an output terminal of the power amplifier 10 and the ground, and that selectively shunts (allows to pass) to the ground a high-frequency signal that has been amplified by the power amplifier 10 and has a frequency that is n times (n is an integer of 2 or more) that of the prescribed band. That is, the harmonic termination circuit 20 shunts to the ground an nth-order harmonic of the high-frequency signal of the prescribed band and thereby enables a high-frequency signal in which the nth-order harmonic has been suppressed to be outputted from the output terminal RFout. In this embodiment, the harmonic termination circuit 20 is a second-order harmonic termination circuit that selectively allows a second-order harmonic, which is a high-frequency signal having a frequency that is twice that of the prescribed band, to pass therethrough. The harmonic termination circuit 20 may instead be configured to selectively allow a harmonic of a third order or higher to pass therethrough.

For example, the harmonic termination circuit 20 is formed of an LC circuit including an inductor L21 and a capacitor C21 connected in series with each other and is configured such that the impedance thereof in a band having a frequency that is twice that of the prescribed band is substantially zero and such that the impedance thereof in other bands is infinity when seen from a collector terminal of the power amplifier 10. The harmonic termination circuit 20 is not limited to this configuration and may instead be formed of a surface acoustic wave (SAW) filter, for example.

The matching network 30 is arranged between the output terminal of the power amplifier 10 and a circuit that is downstream of the power amplifier 10 (output terminal RFout in this embodiment) and performs impedance matching between the output impedance of the power amplifier 10 and the downstream circuit. The matching network 30, for example, includes a series inductor L31 that is connected in series with the line, parallel capacitors C31 and C32 that are connected in parallel with the line and shunt a signal to the ground and a series capacitor C33 that is connected in series with the line. The matching network 30 is configured to perform impedance matching between the output impedance of the power amplifier 10 and the characteristic impedance of a stripline and so forth. The matching network 30 is not limited to this configuration.

Next, the structure of the high-frequency module 1 will be described.

Figure 2:
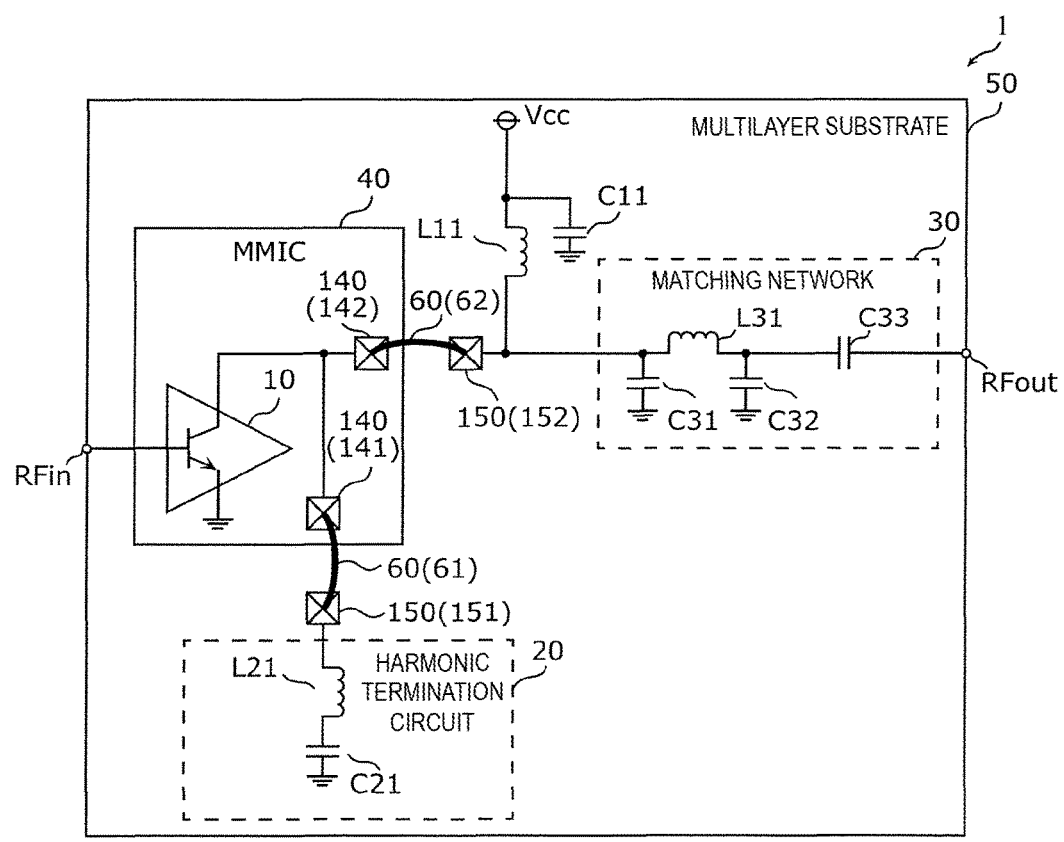
FIG. 2 schematically illustrates the layout of the high-frequency module according to the embodiment.
Figure 3:
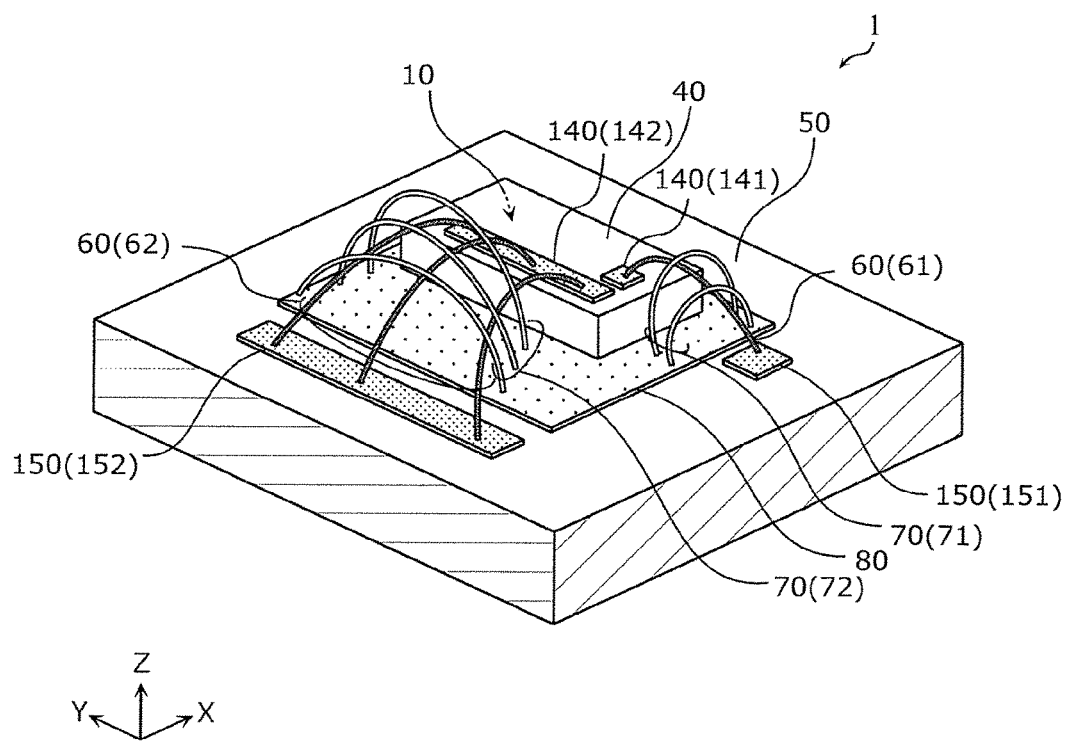
FIG. 3 is a perspective sectional view of a main part of the high-frequency module according to the embodiment.
Figure 4A:
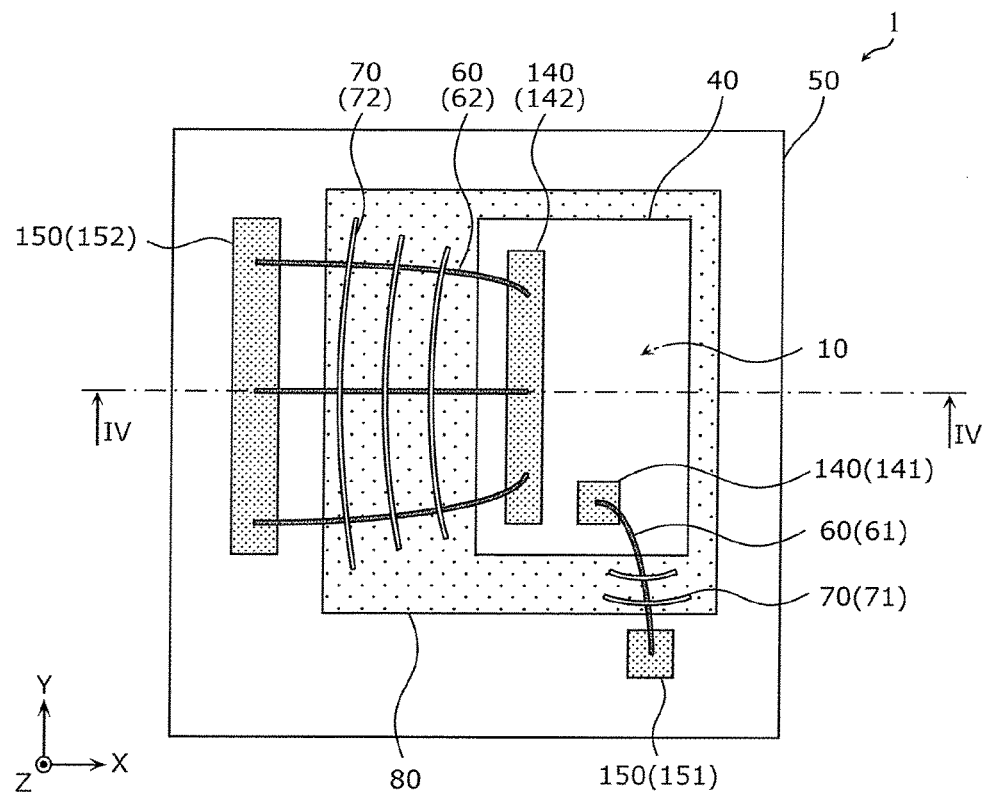
FIG. 4A is a plan view of the main part of the high-frequency module according to the embodiment.
Figure 4B:
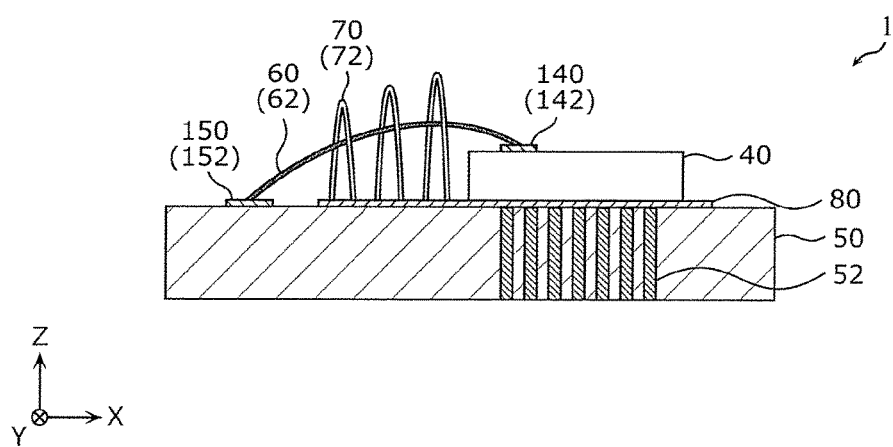
FIG. 4B is a sectional view taken along line IV-IV in FIG. 4A.

FIG. 2 schematically illustrates the layout of the high-frequency module 1 according to this embodiment. In addition, FIGS. 3 to 4B illustrate a main part of the configuration of the high-frequency module 1 according to this embodiment. Specifically, FIG. 3 is a perspective sectional view of the main part, FIG. 4A is a plan view of the main part and FIG. 4B is a sectional view taken along line IV-IV in FIG. 4A.

In FIGS. 3 to 4B, although a positive Z axis direction side is an upper side and directions perpendicular to the Z axis directions and orthogonal to each other are X axis and Y axis directions, depending on the state of use, a case where the positive Z axis direction side is not an upper side may also be considered. Therefore, the positive Z axis direction side is not limited to being the upper side. In addition, in FIGS. 3 to 4B, planar electrodes, wires and so on, which will be described later, may be shaded with hatching for clarity. Furthermore, FIGS. 3 to 4B conceptually illustrate the positional relationships between the constituent elements. Therefore, in FIG. 4B, a wire at the rear side of the paper (positive Y axis direction side) that is superposed with a wire at the front side of the paper (negative Y axis direction side) and strictly speaking would not be visible is also illustrated. The same is also true in subsequent drawings.

As illustrated in FIGS. 2 to 4B, the high-frequency module 1 includes a monolithic microwave integrated circuit (MMIC) 40, which has the power amplifier 10 built therein, a multilayer substrate 50, signal wires 60, ground wires 70 and so on. In addition, the high-frequency module 1 may include chip components such as inductors and capacitors mounted on the multilayer substrate 50, but illustration of such chip components is omitted.

The MMIC 40 is a high-frequency component such as an IC chip that includes a semiconductor substrate composed of Si, GaAs or the like in which the power amplifier 10 is formed. As illustrated in FIGS. 2 and 3, the MMIC 40 is mounted on the multilayer substrate 50 using a conductive adhesive paste (SCP), a thermally curable resin having an insulating property or the like. In other words, the MMIC 40 is arranged so as to stacked on the multilayer substrate 50.

In addition, as illustrated in FIG. 3, the MMIC 40 has pad electrodes 140, which output a signal amplified by the power amplifier 10, on a surface thereof and in this embodiment the MMIC 40 is mounted on the multilayer substrate 50 such that the pad electrodes 140 face upward (toward positive Z axis direction side). The pad electrodes 140 include a pad electrode 141 that is for outputting a high-frequency signal from the MMIC 40 to the harmonic termination circuit 20 and a pad electrode 142 that is for outputting a high-frequency signal from the MMIC 40 to the matching network 30.

In addition to the power amplifier 10, for example, the harmonic termination circuit 20 or the matching network 30 may be at least partially built into the MMIC 40.

The multilayer substrate 50 is a circuit board on which the MMIC 40 is mounted and is for example formed by stacking a plurality of sheets composed of ceramic substrates on top of one another. Along with the MMIC 40, conductors that realize the circuit configuration of the high-frequency module 1 illustrated in FIG. 1 and have silver as a main component, for example, are formed in or on the multilayer substrate 50. These conductors include pattern conductors (surface electrodes and in-plane conductors) that are arranged parallel to a main surface of the multilayer substrate 50 and via conductors (interlayer connection conductors) that are arranged perpendicular to the main surface. In addition, the inductors and capacitors illustrated in FIG. 1 are mounted on or built into the multilayer substrate 50, for example.

Furthermore, as illustrated in FIG. 3, the multilayer substrate 50 has a ground electrode 80 and pad electrodes 150 on an upper surface, which is the surface on upper side, thereof. In addition, since the power amplifier 10 is a heat-generating element, the MMIC 40, which has the power amplifier 10 built therein, is a heat-generating component. Therefore, as illustrated in FIG. 4B, the multilayer substrate 50 has thermal vias 52 that are for radiating heat from the MMIC 40.

The ground electrode 80 is a ground-potential surface electrode that is arranged on the upper surface of the multilayer substrate 50. In this embodiment, the ground electrode 80 is formed of a single pattern conductor having a substantially rectangular shape in a plan view of the multilayer substrate 50, as illustrated in FIG. 4A. Specifically, the ground electrode 80 is arranged in a substantially rectangular shape so as to contain the MMIC 40 and the ground wires 70 therein in a plan view. That is, the pattern conductor that forms the ground electrode 80 is connected to the thermal vias 52 below the MMIC 40 and is connected to both ends of the ground wires 70 below end portions of the ground wires 70.

It is sufficient that the ground potential be the potential of the circuit ground (reference potential) of the high-frequency module 1 but may instead be 0 V or a different potential from the earth.

The pad electrodes 150 are surface electrodes that are arranged on the upper surface of the multilayer substrate 50 and are surface electrodes for wire bonding the signal wires 60 and the ground wires 70, for example. The pad electrodes 150 include a pad electrode 151 that is for receiving a high-frequency signal to be inputted to the harmonic termination circuit 20 and a pad electrode 152 that is for receiving a high-frequency signal to be inputted to the matching network 30.

The thermal vias 52 are vias for allowing heat generated by the MMIC 40 to radiate through the multilayer substrate 50 and a plurality of the thermal vias 52 are arranged so as to penetrate through the multilayer substrate 50 in the thickness direction at positions below a thermal land of the MMIC 40, for example. The thermal vias 52 are not limited to this configuration and, for example, it is sufficient that the thermal vias 52 penetrate in the thickness direction through at least some of the layers of the multilayer substrate 50. In addition, a plurality of thermal vias 52 do not necessarily have to be arranged and it is sufficient that at least one thermal via 52 be arranged.

The signal wires 60 are conductive members that are arranged above the multilayer substrate 50 and are connected to the MMIC 40. In addition, the signal wires 60 form transmission paths that transmit therethrough a high-frequency signal outputted from the MMIC 40. In this embodiment, the signal wires 60 are second wires each of which has one end connected to the MMIC 40 and another end connected to the multilayer substrate 50, and connects a pad electrode 140 of the MMIC 40 and a pad electrode 150 on the upper surface of the multilayer substrate 50. Specifically, the signal wires 60 include a signal wire 61 that transmits a high-frequency signal that has been amplified by the power amplifier 10 and has a frequency that is n times that of the prescribed band (two times in this embodiment) and signal wires 62 that transmit the high-frequency signal of the prescribed band that has been amplified by the power amplifier 10.

One end of the signal wire 61 is connected to the pad electrode 141 and the other end of the signal wire 61 is connected to the pad electrode 151. One end of each signal wire 62 is connected to the pad electrode 142 and the other end of each signal wire 62 is connected to the pad electrode 152.

Here, the power of high-frequency signal amplified by the power amplifier 10 in the prescribed band is higher than the power of the high-frequency signal having a frequency n times that of the prescribed band. Accordingly, in this embodiment, only one signal wire 61 that transmits the high-frequency signal having a frequency that is n times that of the prescribed band is arranged, whereas a plurality (here, three) of the signal wires 62 that transmit the high-frequency signal of the prescribed band are arranged. Therefore, the pad electrodes 142 and 152, which are connected to the plurality of signal wires 62, are larger than the pad electrodes 141 and 151, which are connected to the one signal wire 61, and are arranged in the form of strips, for example. The numbers of signal wires 61 and 62 are not limited to the numbers described above and just one of each may be provided or a plurality of each may be provided.

The ground wires 70 are first wires each of which has at least one end connected to the ground electrode 80 on the upper surface of the multilayer substrate 50 and are arranged so as to straddle the signal wires 60. In this embodiment, the ground wires 70 straddle the signal wires 60 and both ends thereof are connected to a ground potential surface electrode, and specifically are connected to the ground electrode 80, which is formed of a single pattern conductor.

Furthermore, the ground wires 70 are arranged so as to intersect the signal wires 60 in a plan view of the multilayer substrate 50 and in this embodiment are arranged so as to be orthogonal to the signal wires 60. The ground wires 70 are not limited to this arrangement and may be arranged so as to be diagonal with respect to the signal wires 60 in a plan view.

The ground wires 70 include ground wires 71 that straddle the signal wire 61 and ground wires 72 that straddle the signal wires 62.

A plurality of the ground wires 71 and a plurality of the ground wires 72 are arranged. Specifically, a plurality (here, two) of ground wires 71 are arranged with a prescribed interval therebetween in a direction in which the signal wire 61 extends in a plan view of the multilayer substrate 50. In addition, a plurality (here, three) of ground wires 72 are arranged with a prescribed interval therebetween in a direction in which the signal wires 62 extend in the plan view. Furthermore, the ground wires 72 are arranged so as to each straddle a plurality of signal wires 62.

Although the arrangement intervals between the ground wires 71 and the ground wires 72 are not especially limited, from the viewpoint of reducing the radiation of a harmonic from the signal wires 60, it is preferable that the arrangement intervals be smaller than the wavelength of the harmonic, for example. In addition, the arrangements of the ground wires 71 and the ground wires 72 are not especially limited and a plurality of the ground wires 71 and a plurality of the ground wires 72 may be arranged with different intervals provided therebetween and the ground wires 71 and the ground wires 72 may be each arranged in a plurality so as to intersect each other in a plan view of the multilayer substrate 50.

Here, "arranged so as to straddle" and "straddle" indicate a state of being at least partially superposed in a plan view of the multilayer substrate 50. In other words, these terms indicate a state where a least part of each ground wire 70 is arranged above a signal wire 60 with a space therebetween.

The signal wires 60 and the ground wires 70 are, for example, bonding wires provided by wire bonding, and, for example, gold, copper or aluminum may be used as the material thereof.

The configuration of the high-frequency module 1 according to this embodiment has been described above. The effect exhibited by the high-frequency module 1 will be described below.

As described above, the high-frequency module 1 according to this embodiment has ground wires 70 that straddle conductive members (here, signal wires 60) that transmit a high-frequency signal from the MMIC 40. Here, since the ground wires 70 are connected to the ground electrode 80, the ground wires 70 function as shield conductors. Therefore, a harmonic radiated from the conductive members is blocked by the ground wires 70 and it is unlikely that the harmonic will radiate to the outside of the ground wires 70. Therefore, the radiation of a harmonic to the outside of the high-frequency module 1 can be reduced.

Here, in the high-frequency module 1 according to this embodiment, the conductive members are signal wires 60 that connect the pad electrodes 140 of the MMIC 40 and the pad electrodes 150 of the multilayer substrate 50. The signal wires 60 are exposed from the multilayer substrate 50 and therefore cannot be shielded by the multilayer substrate 50. Consequently, a harmonic is particularly likely to radiate from the signal wires 60 to the outside of the high-frequency module 1. Therefore, the radiation of a harmonic from a location where a harmonic is likely to radiate can be suppressed as a result of the signal wires 60 being straddled by the ground wires 70 and therefore the radiation of a harmonic to the outside of the high-frequency module 1 can be effectively reduced.

In addition, in the high-frequency module 1 according to this embodiment, since the ground wires 70 intersect the signal wires 60 in a plan view of the multilayer substrate 50, an increase in the size of the high-frequency module 1 in the direction in which the signal wires 60 extend can be suppressed. Therefore, even when there is a restriction on the size of the high-frequency module 1 in a certain direction, the radiation of a harmonic from the high-frequency module 1 can be reduced. This configuration is particularly useful in the case where the high-frequency module 1 is used in a small-sized wireless communication terminal in which high-density mounting of components is required such as a cellular phone.

Furthermore, in the high-frequency module 1 according to this embodiment, since both ends of the ground wires 70 are connected to the ground electrode 80 that is formed of a single pattern conductor, the shielding effect realized by the ground wires 70 can be improved. Specifically, the ground electrode 80, which is connected to both ends of the ground wires 70, is formed so as to be large compared with ground electrodes that would be individually connected to both ends of the ground wires 70. Therefore, impedance of the ground electrode 80 is suppressed and consequently the ground electrode 80 is a ground electrode which is a ground close to a reference potential level and has a stable potential. Thus, the shielding effect is improved due to the potential of the ground wires 70 connected to the ground electrode 80 being stabilized, and therefore the radiation of a harmonic to the outside of the high-frequency module 1 can be further reduced.

Furthermore, in the high-frequency module 1 according to this embodiment, since at least one end of each ground wire 70 (both ends in this embodiment) is connected to the ground electrode 80 that is formed of a pattern conductor that is connected to the thermal vias 52, the shielding effect realized by the ground wires 70 can be further improved. Specifically, the ground electrode 80, which is connected to the thermal vias 52, is a ground electrode which is a ground close to a reference potential level and has a particularly stable potential inside the high-frequency module 1. Therefore, the shielding effect is improved due to the potential of the ground wires 70 connected to the ground electrode 80 being stabilized, and therefore the radiation of a harmonic to the outside of the high-frequency module 1 can be further reduced.

Furthermore, the ground electrode 80 enables heat generated by the MMIC 40 to diffuse and radiate in directions parallel to a main surface of the multilayer substrate 50. Therefore, the degradation of the characteristics of the MMIC 40 caused by heat can be reduced and thus the reliability of the high-frequency module 1 can be improved.

In addition, in the high-frequency module 1 according to this embodiment, since the power amplifier 10 is built into the MMIC 40, a high-frequency signal outputted from the MMIC 40 is a comparatively large signal. In other words, a particularly large harmonic can radiate from the signal wires 60. Therefore, as a result of the signal wires 60 being straddled by the ground wires 70, a particularly large harmonic can be suppressed and therefore the radiation of the harmonic can be effectively reduced.

In addition, in the high-frequency module 1 according to this embodiment, signal wires 60 (signal wires 62 in this embodiment) transmit the high-frequency signal of the pre-scribed band that has been amplified by the power amplifier 10, and therefore can radiate a particularly large harmonic. Therefore, since the particularly large harmonic can be reduced due to the signal wires 60 being straddled by the ground wires 70 (ground wires 72 in this embodiment), the radiation of the harmonic can be effectively reduced.

In addition, in the high-frequency module 1 according to this embodiment, a signal wire 60 (signal wire 61 in this embodiment) transmits the high-frequency signal that has been amplified by the power amplifier 10 and has a frequency that is n times (two times in this embodiment) that of the prescribed band, and therefore can radiate a particularly large harmonic. Therefore, since the particularly large harmonic can be reduced due to the signal wire 60 being straddled by the ground wires 70 (ground wires 71 in this embodiment), the radiation of the harmonic can be effectively reduced.

The ground wires and ground electrodes of the high-frequency module may have different forms from those described in this embodiment. Hereafter, various modifications of the above-described embodiment will be described.

(Modification 1)

Although the ground electrode 80, to which the ground wires 70 are connected, has a substantially rectangular shape in the above-described embodiment, the ground electrode 80 is not limited to having a substantially rectangular shape, and for example, may have a shape obtained by forming a recess in a part of a substantially rectangular shape. Hereafter, as an example, a high-frequency module having such a ground electrode will be described as a high-frequency module according to modification 1. In this modification and other modifications thereafter, the circuit configuration of the high-frequency module is the same as that of the above-described embodiment and therefore the description thereof will be omitted.

Figure 5:
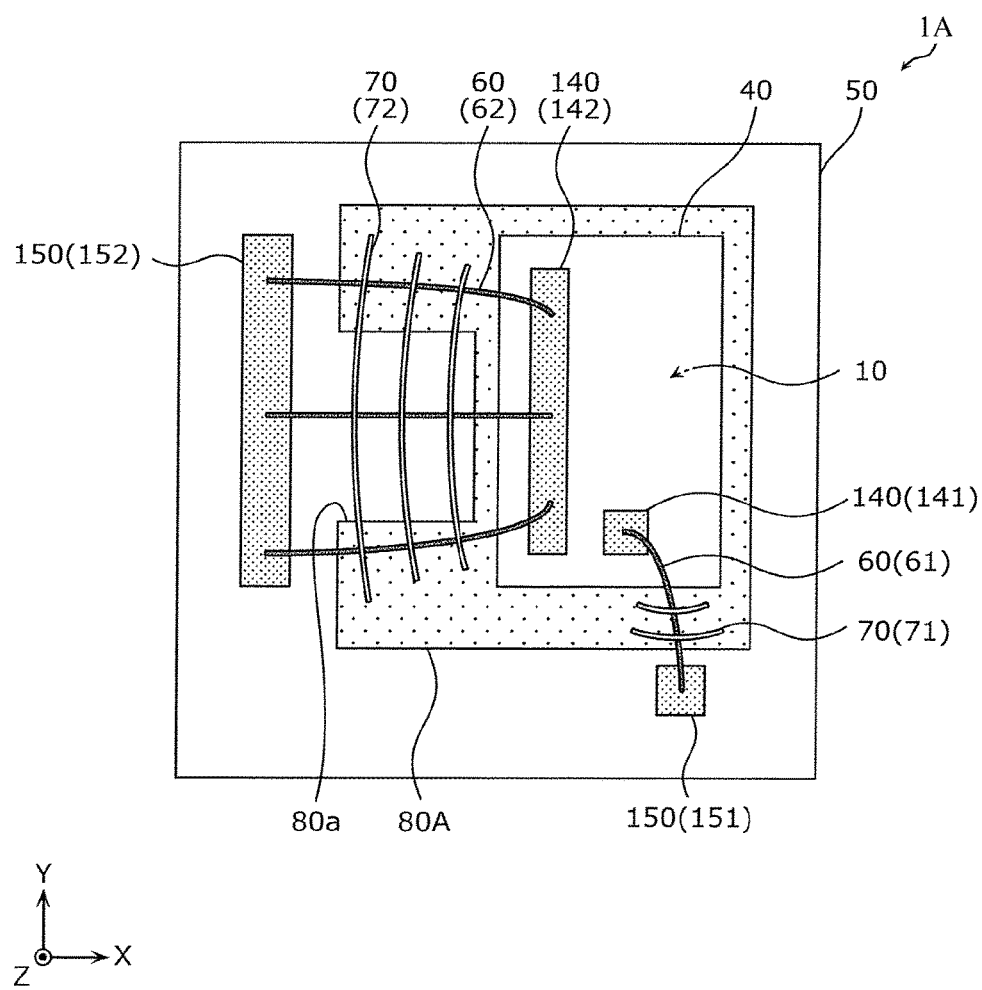
FIG. 5 is a plan view of a main part of a high-frequency module according to modification 1 of the embodiment.

FIG. 5 illustrates a main part of the configuration of a high-frequency module 1A according to modification 1 of the embodiment and specifically is a plan view of the main part. In contrast to the high-frequency module 1 according to the embodiment, the high-frequency module 1A illustrated in FIG. 5 includes a ground electrode 80A instead of the ground electrode 80.

The ground electrode 80A is formed of a single pattern electrode and has a shape in which a recess 80a is formed in a part of a substantially rectangular shape arranged so as to contain the MMIC 40 and the ground wires 70 therein in a plan view of the multilayer substrate 50. In other words, the ground electrode 80A is connected to the thermal vias 52 below the MMIC 40 and to both ends of the ground wires 70 below the ground wires 70 and the recess 80a is formed in the ground electrode 80 so as avoid the region underneath the ground wires 70.

In the thus-configured high-frequency module 1A according to this modification as well, since the harmonic radiated from the signal wires 60 is blocked by the ground wires 70, the radiation of the harmonic to the outside of the high-frequency module 1A can be reduced, similarly to the above-described embodiment.

(Modification 2)

Although the ground electrode 80 or 80A, to which the ground wires 70 are connected, is formed of a pattern conductor that is connected to the thermal vias 52 in the above-described embodiment and modification 1, the ground electrode may instead be formed of a different pattern conductor from the pattern conductor that is connected to the thermal vias 52. Hereafter, as an example, a high-frequency module having such a ground electrode will be described as a high-frequency module according to modification 2.

Hereafter, although the description of a ground electrode to which the ground wires 72 are connected will be given as an example and the description of a ground electrode to which the ground wires 71 are connected will be omitted, the description also applies to that ground electrode.

Figure 6A:
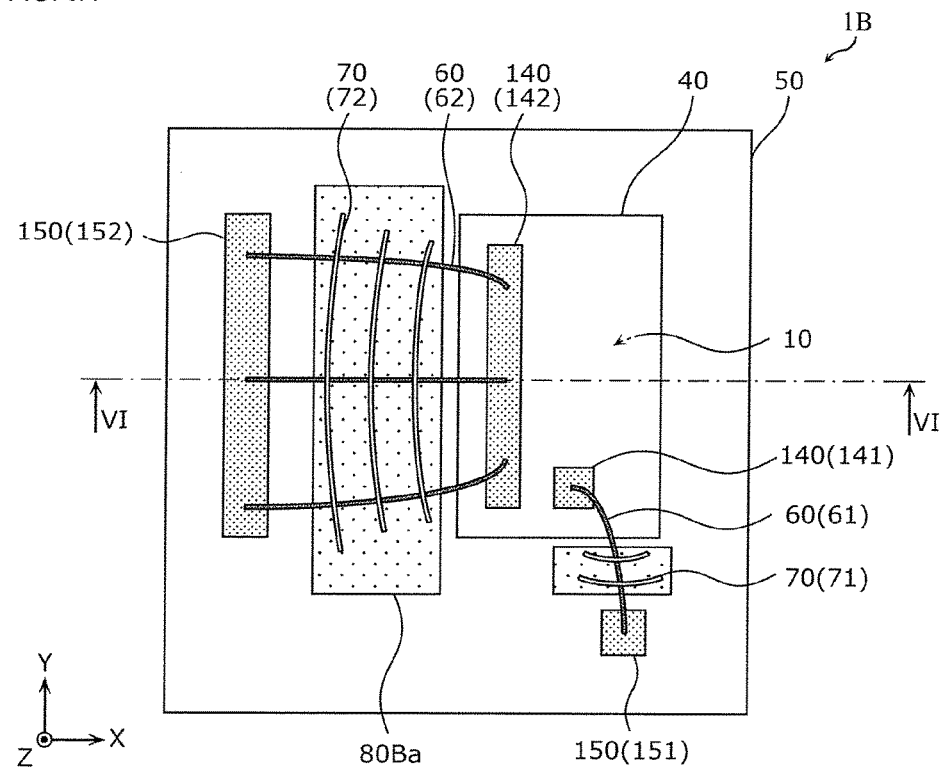
FIG. 6A is a plan view of a main part of a high-frequency module according to modification 2 of the embodiment.
Figure 6B:
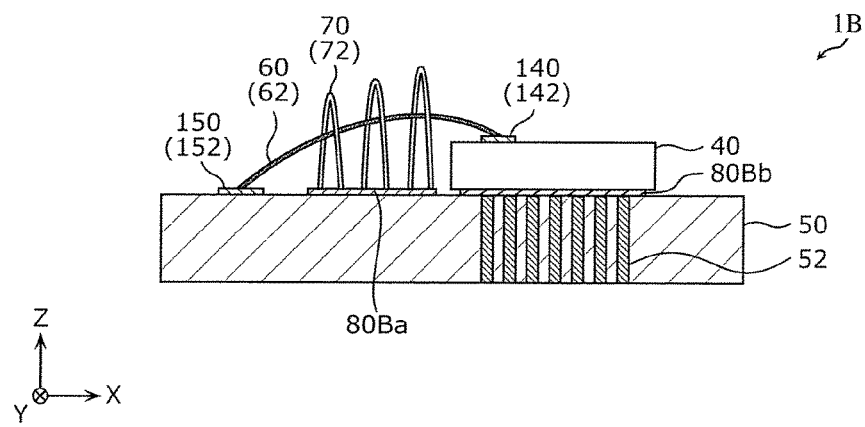
FIG. 6B is a sectional view taken along line VI-VI in FIG. 6A.

FIGS. 6A and 6B illustrate a main part of a high-frequency module 1B according to modification 2 of the embodiment, and specifically, FIG. 6A is a plan view of the main part and FIG. 6B is a sectional view taken along line VI-VI in FIG. 6A. In contrast to the high-frequency module 1 according to the embodiment, the high-frequency module 1B illustrated in FIGS. 6A and 6B includes ground electrodes 80Ba and 80Bb instead of the ground electrode 80.

As illustrated in FIGS. 6A and 6B, in this modification, the pattern conductor that forms the ground electrode 80Ba that is connected to the ground wires 72 is not connected to the thermal vias 52. In addition, the ground electrode 80Bb that is structurally connected to the thermal vias 52 is arranged on the multilayer substrate 50, which is located below the MMIC 40.

Specifically, in contrast to the ground electrode 80 of the above-described embodiment, the ground electrode 80Ba is arranged in a substantially rectangular shape so as to include the ground wires 72 therein and so as not to include the MMIC 40 therein in a plan view of the multilayer substrate 50. In other words, the ground electrode 80Ba is arranged on the multilayer substrate 50 so as to be separated from the ground electrode 80Bb, which is structurally connected to the thermal vias 52.

The ground electrode 80Bb is a surface electrode (thermal pad) for allowing heat generated by the MMIC 40 to diffuse and radiate in directions parallel to a main surface of the multilayer substrate 50, and is arranged on the multilayer substrate 50 at a position below a thermal land of the MMIC 40, for example. Although it is preferable that the ground electrode 80Bb be arranged in the high-frequency module 1B from the viewpoint of thermal diffusivity, the ground electrode 80Bb does not necessarily have to be arranged in the high-frequency module 1B.

Compared with the above-described embodiment, the thus-configured high-frequency module 1B according to this modification is able to exhibit the same effect, although the effect is somewhat reduced. That is, the harmonic radiated by the signal wires 60 is blocked by the ground wires 70, and therefore the radiation of the harmonic to the outside of the high-frequency module 1B can be reduced.

(Modification 3)

Although both ends of the ground wires 70 are connected to the ground electrode 80, 80A, 80Ba or the like formed of a single pattern conductor in the above-described embodiment and modifications 1 and 2, the two ends of the ground wires 70 may instead be connected to ground electrodes formed of different pattern conductors. Hereafter, as an example, a high-frequency module having such a ground electrode will be described as a high-frequency module according to modification 3.

Figure 7A:
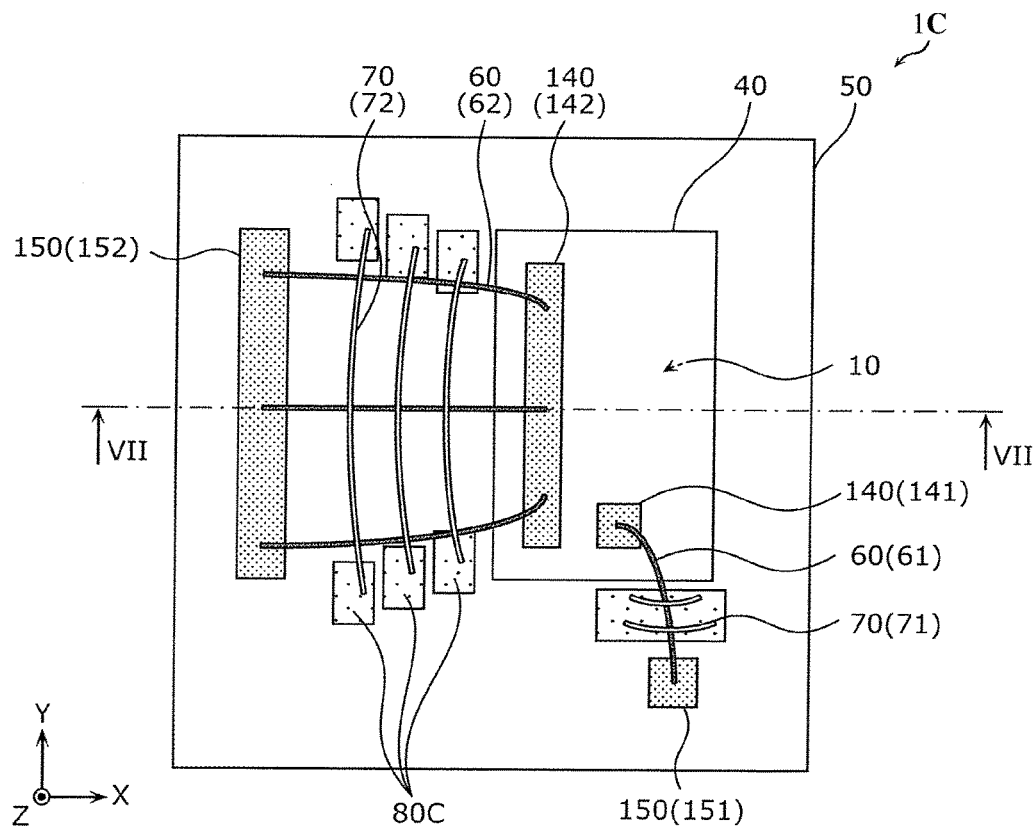
FIG. 7A is a plan view of a main part of a high-frequency module according to modification 3 of the embodiment.
Figure 7B:
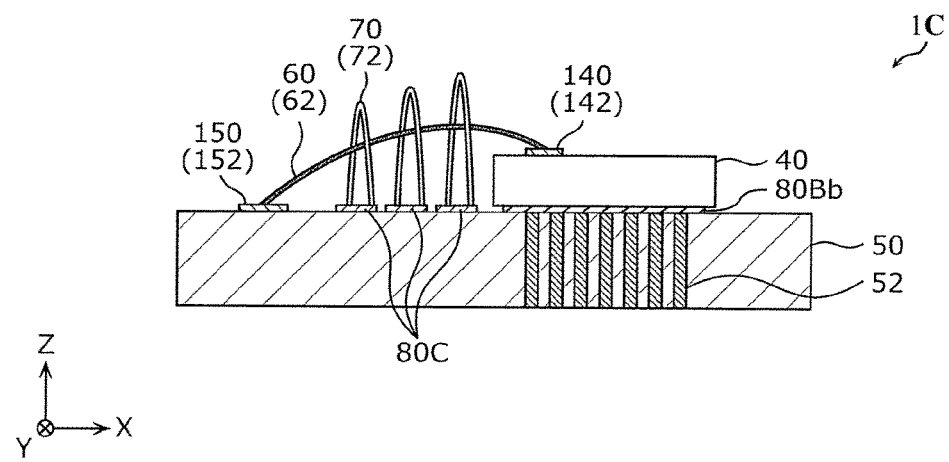
FIG. 7B is a sectional view taken along line VII-VII in FIG. 7A.

FIGS. 7A and 7B illustrate a main part of the configuration of a high-frequency module 1C according to modification 3 of the embodiment, and specifically, FIG. 7A is a plan view of the main part and FIG. 7B is a sectional view taken along line VII-VII in FIG. 7A. In contrast to the high-frequency module 1B according to modification 2 of the embodiment, the high-frequency module 1C illustrated in FIGS. 7A and 7B includes ground electrodes 80C instead of the ground electrode 80Ba.

In contrast to the ground electrode 80Ba of modification 2, different conductor patterns are connected to the one ends of the ground wires 72 and to the other ends of the ground wires 72 among the ground electrodes 80C. That is, the pattern conductors connected to the one ends and the pattern conductors connected to the other ends are arranged so as to be separated from each other.

Compared with the above-described modification 2 of the embodiment, the thus-configured high-frequency module 1C according to this modification is able to exhibit the same effect, although the effect is somewhat reduced. That is, the harmonic radiated by the signal wires 60 is blocked by the ground wires 70, and therefore the radiation of the harmonic to the outside of the high-frequency module 1C can be reduced.

(Modification 4)

Although the ground wires 72 are arranged so as to each straddle the plurality of signal wires 62 in the above-described embodiment and modifications 1 to 3, the ground wires may instead be arranged so that the plurality of signal wires 62 are individually straddled by the ground wires. Hereafter, as an example, a high-frequency module having such ground wires will be described as a high-frequency module according to modification 4.

Figure 8:
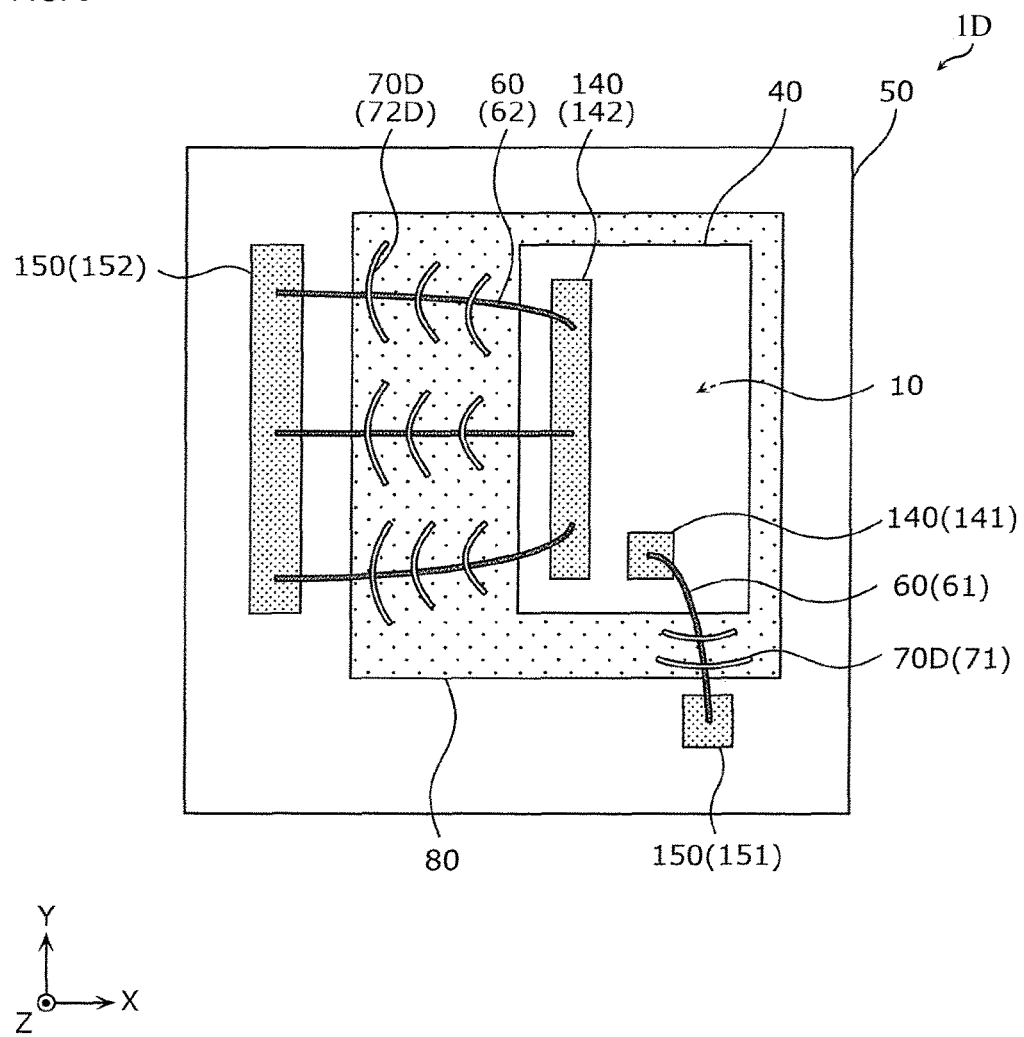
FIG. 8 is a plan view of a main part of a high-frequency module according to modification 4 of the embodiment.

FIG. 8 illustrates a main part of the configuration of a high-frequency module 1D according to modification 4 of the embodiment and specifically is a plan view of the main part. In contrast to the high-frequency module 1 according to the embodiment, the high-frequency module 1D illustrated in FIG. 8 includes ground wires 70D instead of the ground wires 70.

In contrast to the ground wires 70 of the embodiment, the ground wires 70D include a plurality of ground wires 72D each of which straddles a corresponding one of the plurality of signal wires 62, instead of the ground wires 72 that arranged so as to each straddle the plurality of signal wires 62. Specifically, each ground wire 72 straddles three signal wires 62 in the embodiment, whereas each ground wire 72D is arranged to straddle only one signal wire 62 in this modification.

In the thus-configured high-frequency module 1D according to this modification as well, since the harmonic radiated from the signal wires 60 is blocked by the ground wires 70D, the radiation of the harmonic to the outside of the high-frequency module 1D can be reduced, similarly to the above-described embodiment.

In addition, as a result of the ground wires 70D individually straddling the plurality of signal wires 60 in this modification, the radiation of the harmonic from the spaces between adjacent signal wires 60 can be suppressed to a greater extent compared with the case where one ground wire straddles a plurality of signal wires 60.

(Modification 5)

Although the ground wires 70 or 70D intersect the signal wires 60 in a plan view of the multilayer substrate 50 in the above-described embodiment and modifications 1 to 4, it is sufficient that the ground wires be arranged so as to straddle the signal wires 60 and the ground wires may be arranged so as not to intersect the signal wires 60 in a plan view. Hereafter, as an example, a high-frequency module having such ground wires will be described as a high-frequency module according to modification 5.

Figure 9A:
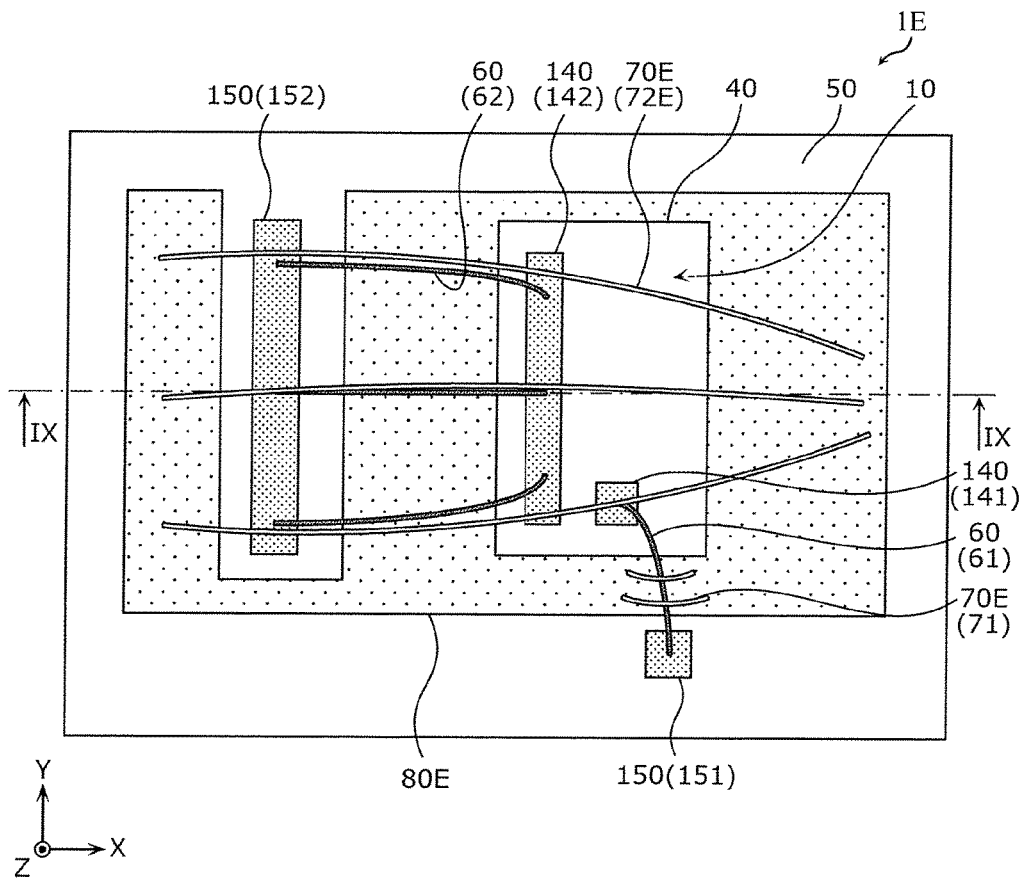
FIG. 9A is a plan view of a main part of a high-frequency module according to modification 5 of the embodiment.
Figure 9B:
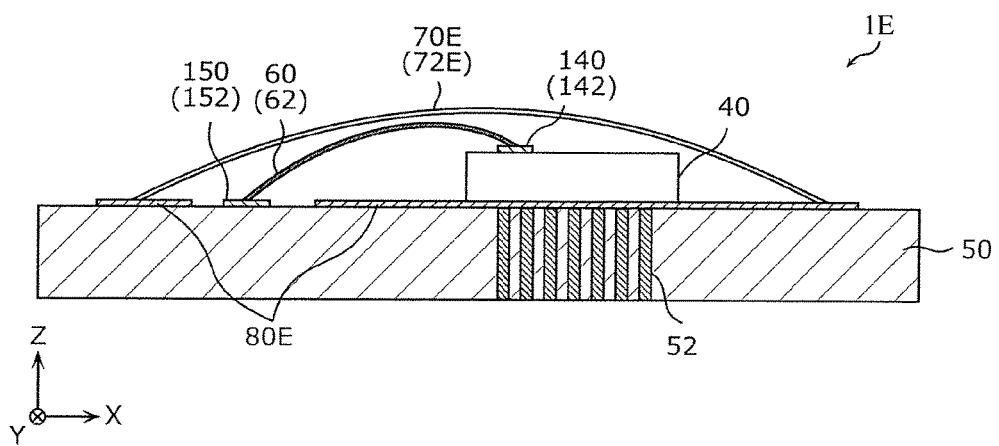
FIG. 9B is a sectional view taken along line IX-IX in FIG. 9A.

FIGS. 9A and 9B illustrate a main part of the configuration of a high-frequency module 1E according to modification 5 of the embodiment, and specifically, FIG. 9A is a plan view of the main part and FIG. 9B is a sectional view taken along line IX-IX in FIG. 9A. In FIG. 9A, ground wires 72E are superposed with signal wires 62 but are illustrated so as to be somewhat shifted from their actual positions for clarity.

In contrast to the high-frequency module 1 according to the embodiment, the high-frequency module 1E illustrated in FIGS. 9A and 9B includes ground wires 70E and a ground electrode 80E instead of the ground wires 70 and the ground electrode 80.

In contrast to the ground wires 70 of the embodiment, the ground wires 70E include ground wires 72E instead of the ground wires 72, which are arranged so as to intersect the signal wires 62 in a plan view of the multilayer substrate 50. The ground wires 72E are arranged so as not to intersect the signal wires 62 and so as to be superposed with the signal wires 62 in a plan view. Specifically, the ground wires 70E straddle the pad electrode 152, the signal wires 60 and the MMIC 40 having the pad electrode 142 in such a way as to be superposed with the signal wires 62 in a plan view and are connected to the ground electrode 80E.

In contrast to the ground electrode 80 of the embodiment, the ground electrode 80E is formed so as to be larger in the X axis direction. With this configuration, the ground electrode 80E, which is formed of a single pattern conductor, can be connected to the ground wires 70E that straddle the pad electrode 152, the signal wires 60 and the MMIC 40 having the pad electrode 142.

The ground electrode 80E is not limited to this configuration and, for example, the ground electrode 80E may be instead formed of two pattern conductors arranged at positions that face each other with the signal wires 62 interposed therebetween in a plan view of the multilayer substrate 50. In other words, the ground electrode 80E may be formed of a pattern conductor that is arranged on the negative X axis direction side of the pad electrode 152 and a pattern conductor that is arranged on the positive X axis direction side of the MMIC 40.

In the thus-configured high-frequency module 1E according to this modification as well, since the harmonic radiated from the signal wires 60 is blocked by the ground wires 70E, the radiation of the harmonic to the outside of the high-frequency module 1E can be reduced, similarly to the above-described embodiment.

Furthermore, in this modification, since the ground wires 72E are arranged so as not to intersect the signal wires 62 and so as to be superposed with the signal wires 62 in a plan view of the multilayer substrate 50, it is possible to suppress an increase in the size of the high-frequency module 1E in a direction that intersects the direction in which the signal wires 62 extend.

(Modification 6)

In the above-described embodiment and modifications 1 to 5, it was described that it is possible to reduce the radiation of a harmonic to the outside of a high-frequency module by arranging ground wires 70 that straddle signal wires that form transmission paths that transmit a high-frequency signal outputted from the MMIC 40. However, the same techniques can also be applied to a configuration in which pattern conductors are used as the transmission paths. Hereafter, as an example, a high-frequency module having such transmission paths will be described as a high-frequency module according to modification 6.

Figure 10:
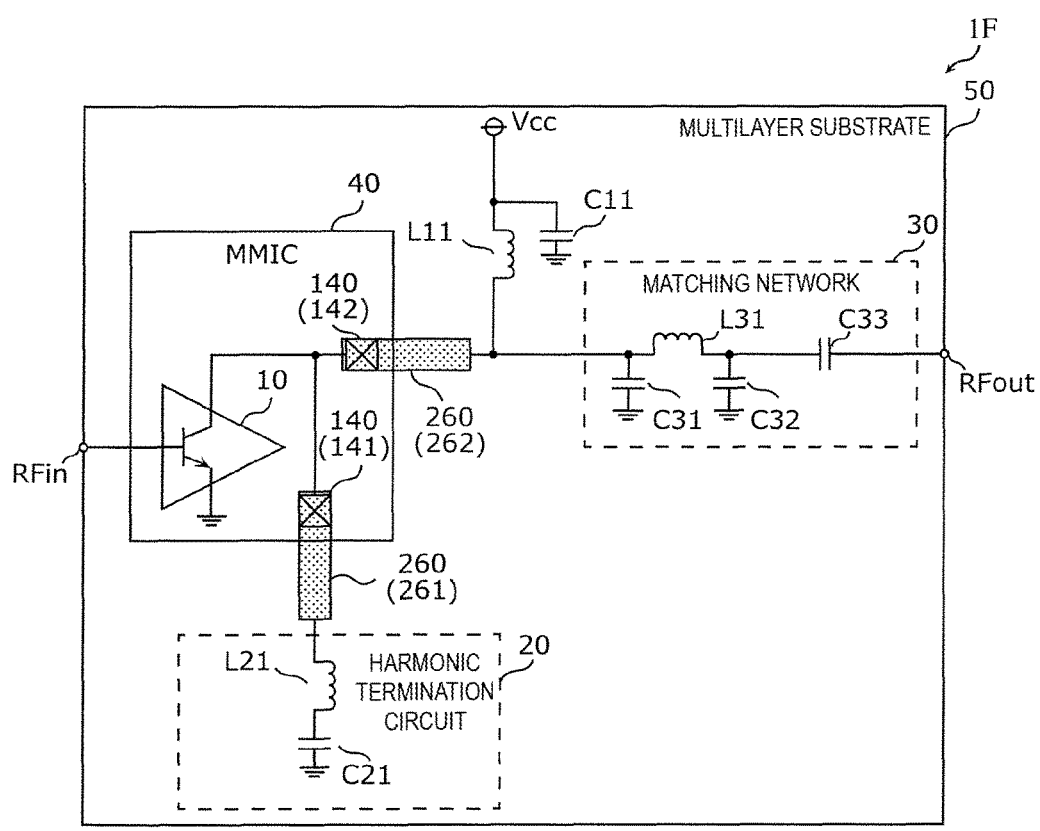
FIG. 10 schematically illustrates the layout of the high-frequency module according to modification 6 of the embodiment.
Figure 11:
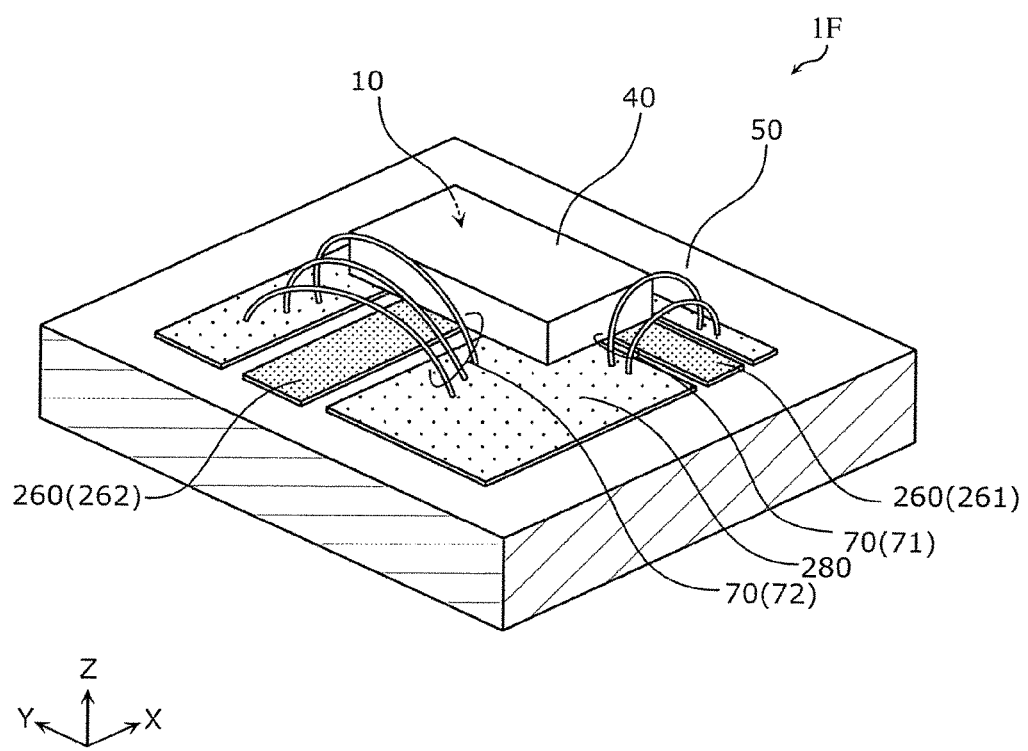
FIG. 11 is a perspective sectional view of a main part of a high-frequency module according to modification 6 of the embodiment.

FIG. 10 schematically illustrates the layout of a high-frequency module 1F according to modification 6 of the embodiment. FIG. 11 illustrates a main part of the configuration of the high-frequency module 1F according to modification 6 of the embodiment. Specifically, FIG. 11 is a perspective sectional view of the main part.

The high-frequency module 1F illustrated in FIGS. 10 and 11 differs from the high-frequency module 1 according to the embodiment in the following way.

In the embodiment, the MMIC 40 is mounted face up on the multilayer substrate 50 such that the pad electrodes 140 face upward and the signal wires 60 are arranged as transmission paths that transmit the high-frequency signal outputted from the MMIC 40. In contrast, in this modification, the MMIC 40 is mounted face down on the multilayer substrate 50 such that the pad electrodes 140 face downward and pattern conductors 260 are arranged as the transmission paths. In addition, in contrast to the embodiment, as well as the MMIC 40 being mounted face down and the pattern conductors 260 being arranged, the pad electrodes 150 are not arranged and a ground electrode 280 is arranged instead of the ground electrode 80 in this modification.

The pattern conductors 260 are conductive members that are arranged on the multilayer substrate 50 and are connected to the MMIC 40. In addition, the pattern conductors 260 are transmission paths that transmit a high-frequency signal outputted from the MMIC 40. Specifically, the pattern conductors 260 are for example micro-striplines that are arranged on the upper surface of the multilayer substrate 50 and are connected to the pad electrodes 140 of the MMIC 40.

Compared to the ground electrode 80 of the embodiment, the ground electrode 280 is arranged so as to avoid regions where the pattern conductors 260 are arranged.

In the thus-configured high-frequency module 1F according to this modification as well, since the harmonic radiated from the pattern conductors 260 is blocked by the ground wires 70, the radiation of the harmonic to the outside of the high-frequency module 1F can be reduced, similarly to the above-described embodiment.

Here, the pattern conductors 260 are exposed from the multilayer substrate 50, and therefore cannot be shielded by the multilayer substrate 50, similarly to the signal wires 60 in the embodiment. Consequently, a harmonic is particularly likely to radiate from the pattern conductors 260 to the outside of the high-frequency module 1F. Therefore, the radiation of a harmonic from a location where a harmonic is likely to radiate can be suppressed as a result of the pattern conductors 260 being straddled by the ground wires 70 and therefore the radiation of a harmonic to the outside of the high-frequency module 1F can be effectively reduced.

Furthermore, in this modification, a reduction in the profile of the high-frequency module 1F is achieved as a result of the pattern conductors 260 being provided as the transmission paths that transmit a high-frequency signal from the MMIC 40 compared with the case where signal wires are provided as the transmission paths.

(Other Modifications)

High-frequency modules according an embodiment of the present disclosure and modifications of the embodiment have been described, but the present disclosure is not limited to the embodiment and the modifications of the embodiment. Various modifications, which are thought of by a person skilled in the art, made to the embodiment and the modifications of the embodiment and other embodiments formed by combining different constituent elements of the embodiment and modifications of the embodiment may be included in the scope of one or plural modes of the present disclosure so long as they do not depart from the gist of the present disclosure.

For example, in the above description, the high-frequency module includes the bias circuit, the harmonic termination circuit 20 and the matching network 30, but the high-frequency module does not necessarily have to include these components. In other words, it is sufficient that the high-frequency module include a high-frequency component (MMIC 40 in above description), a circuit board (multilayer substrate in above description), a conductive member that serves as a transmission path that transmits a high-frequency signal outputted from the high-frequency component and a ground wire that is arranged so as to straddle the conductive member.

Furthermore, in the above description, the MMIC 40 having the power amplifier 10 built therein is described as an example of the high-frequency component, but the high-frequency component is not limited to this configuration and may instead be a microwave integrated circuit (MIC) or a hybrid integrated circuit (HIC), for example.

In addition, the high-frequency component is not limited to a component having the power amplifier 10 built therein and may be component having an active element such as an oscillator or a low noise amplifier (LNA) built therein or may be a component having a passive element such as a filter or a duplexer built therein.

Furthermore, in the above description, ground wires are arranged so as to straddle both a conductive member that transmits a high-frequency signal of a prescribed band outputted from the MMIC 40 and a conductive member that transmits a high-frequency signal that has been output by the MMIC 40 and has a frequency that is n times that of the prescribed band. However, a conductive member for which a ground wire is arranged so as to straddle may be just either one of these type of conductive members.

In addition, in the above description, both ends of each ground wire are connected to the ground electrode, but just one end of each ground wire may instead be connected to the ground electrode. However, it is preferable that both ends of the ground wires be connected to the ground electrode in order to increase the effect of reducing a harmonic.

Furthermore, in the above description, signal wires are connected to the multilayer substrate 50, but the signal wires are not limited to this configuration. For example, the high-frequency module may include two face-up-mounted high-frequency components and one end of a signal wire may be connected to one high-frequency component and the other end of the signal wire may be connected to the other high-frequency component.

In addition, in the above description, the multilayer substrate 50 is described as an example of the circuit board, but the circuit board is not limited to this configuration and may be a double-sided or single-sided printed board, for example.

The present disclosure can be widely used as a high-frequency module in communication devices such as cellular phones.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A high-frequency module comprising:
a circuit board;
a high-frequency component on a surface of circuit board;
a signal wire arranged above or on the circuit board, wherein the signal wire is electrically connected to the high-frequency component and the circuit board, and is a transmission path transmitting a high-frequency signal outputted from the high-frequency component; and
a ground electrode on the surface of the circuit board, the ground electrode being a single pattern conductor;
a ground wire having at least one end connected to the ground electrode,
wherein
the high-frequency component is a power amplifier which has a mounting surface and a top surface opposite to the mounting surface, the mounting surface being the circuit board side, and has a first pad electrode and a second pad electrode on the top surface, the first electrode pad being to output the high-frequency signal from the power amplifier to a harmonic termination circuit, the second pad electrode being to output the high-frequency signal from the power amplifier to a matching network,
the circuit board has a third pad electrode and a fourth pad electrode on the surface of the circuit board, the third electrode pad being to receive the high-frequency signal input in the harmonic termination circuit, the fourth pad electrode being to receive the high-frequency signal to input the matching network,
the signal wire includes
a first signal wire connected to the first pad electrode and the third pad electrode, and
a second signal wire connected to the second pad electrode and the fourth pad electrode, and the ground wire includes
a first ground wire so as to straddle the first signal wire, and
a second ground wire so as to straddle the second signal wire, the second ground wire being different from the first ground wire, and
the power amplifier has a first side, and a second side which is different from the first side, in a plane view in a direction of a perpendicular of the top surface, and
the first signal wire is arranged so as to straddle the first side of the power amplifier, and
the second signal wire is arranged so as to straddle the second side of the power amplifier.

2. The high-frequency module according to claim 1, wherein the first wire intersects the conductive member in a plan view of the circuit board.

3. The high-frequency module according to claim 1, wherein both ends of the first wire are connected to the ground electrode, the ground electrode comprising a single pattern conductor.

4. The high-frequency module according to claim 1, wherein the circuit board has a thermal via allowing heat generated by the high-frequency component to radiate through the circuit board, at least one end of the first wire is connected to the ground electrode, the ground electrode being connected to the thermal via and comprising a pattern conductor.

5. The high-frequency module according to claim 1, wherein the high-frequency component comprises a power amplifier amplifying a signal of a prescribed band.

6. The high-frequency module according to claim 5, wherein the conductive member transmits the high-frequency signal of the prescribed band amplified by the power amplifier.

7. The high-frequency module according to claim 5, wherein the conductive member transmits the high-frequency signal amplified by the power amplifier and has a frequency n times a frequency of the prescribed band, wherein n is an integer of 2 or higher.

8. The high-frequency module according to claim 1, wherein the conductive member is a second wire connecting a pad electrode of the high-frequency component and to a pad electrode of the circuit board.

9. The high-frequency module according to claim 1, wherein the conductive member is a pattern conductor arranged on an upper surface of the circuit board.

10. The high-frequency module according to claim 2, wherein both ends of the first wire are connected to the ground electrode, the ground electrode comprising a single pattern conductor.

11. The high-frequency module according to claim 2, wherein the circuit board has a thermal via allowing heat generated by the high-frequency component to radiate through the circuit board, at least one end of the first wire is connected to the ground electrode, the ground electrode being connected to the thermal via and comprising a pattern conductor.

12. The high-frequency module according to claim 3, wherein the circuit board has a thermal via allowing heat generated by the high-frequency component to radiate through the circuit board, at least one end of the first wire is connected to the ground electrode, the ground electrode being connected to the thermal via and comprising a pattern conductor.

13. The high-frequency module according to claim 2, wherein the high-frequency component comprises a power amplifier amplifying a signal of a prescribed band.

14. The high-frequency module according to claim 3, wherein the high-frequency component comprises a power amplifier amplifying a signal of a prescribed band.

15. The high-frequency module according to claim 4, wherein the high-frequency component comprises a power amplifier amplifying a signal of a prescribed band.

16. The high-frequency module according to claim 2, wherein the conductive member is a second wire connecting a pad electrode of the high-frequency component and to a pad electrode of the circuit board.

17. The high-frequency module according to claim 3, wherein the conductive member is a second wire connecting a pad electrode of the high-frequency component and to a pad electrode of the circuit board.

18. The high-frequency module according to claim 4, wherein the conductive member is a second wire connecting a pad electrode of the high-frequency component and to a pad electrode of the circuit board.

19. The high-frequency module according to claim 5, wherein the conductive member is a second wire connecting a pad electrode of the high-frequency component and to a pad electrode of the circuit board.

20. The high-frequency module according to claim 6, wherein the conductive member is a second wire connecting a pad electrode of the high-frequency component and to a pad electrode of the circuit board.

21. The high-frequency module according to claim 1, wherein the first signal wire comprises a plurality of first signal wires, and the first ground wire comprises a plurality of first ground wires, and wherein each of the plurality of first ground wires is arranged so as to straddle only one of the plurality of first signal wires.

* * * * *